US011626366B2

(12) United States Patent
Fowler et al.

(10) Patent No.: US 11,626,366 B2
(45) Date of Patent: Apr. 11, 2023

(54) SHIELDING USING LAYERS WITH STAGGERED TRENCHES

(71) Applicant: Silicon Laboratories Inc., Austin, TX (US)

(72) Inventors: Thomas C. Fowler, Georgetown, TX (US); Jerome T. Wenske, Cedar Creek, TX (US)

(73) Assignee: Silicon Laboratories Inc., Austin, TX (US)

( * ) Notice: Subject to any disclaimer, the term of this patent is extended or adjusted under 35 U.S.C. 154(b) by 124 days.

(21) Appl. No.: 17/360,793

(22) Filed: Jun. 28, 2021

(65) Prior Publication Data

US 2022/0406708 A1 Dec. 22, 2022

Related U.S. Application Data

(60) Provisional application No. 63/213,537, filed on Jun. 22, 2021.

(51) Int. Cl.
*H01L 23/522* (2006.01)
*H01L 21/71* (2006.01)
*H01L 23/00* (2006.01)
*H01L 49/02* (2006.01)

(52) U.S. Cl.
CPC .......... *H01L 23/5225* (2013.01); *H01L 21/71* (2013.01); *H01L 28/40* (2013.01); *H01L 24/05* (2013.01); *H01L 2224/04042* (2013.01)

(58) Field of Classification Search
CPC ..... H01L 28/40; H01L 23/5225; H01L 23/60; H01L 28/56
See application file for complete search history.

(56) References Cited

U.S. PATENT DOCUMENTS 6,066,537 A * 5/2000 Poh ..................... H01L 23/5223 438/251
7,268,645 B2 * 9/2007 Meltzer ................... H01L 28/10 333/175
7,732,301 B1 6/2010 Pinnington et al.
8,405,189 B1 * 3/2013 Ward ....................... H01G 4/33 977/932
8,802,504 B1 8/2014 Hou et al.
(Continued)

FOREIGN PATENT DOCUMENTS

WO WO-2012065229 A1 * 5/2012 ............. H01L 23/48

*Primary Examiner* — Mamadou L Diallo
(74) *Attorney, Agent, or Firm* — Egan, Enders & Huston LLP.

(57) ABSTRACT

An integrated circuit includes a capacitor with a bottom conductive plate and a top conductive plate. A passivation layer is disposed above the top conductive plate. An intermetal dielectric layer is disposed between the bottom conductive plate and the top conductive plate and is formed of a first dielectric material. Shield layers are disposed between the top conductive plate and above the intermetal dielectric layer and extend horizontally to at least past guard rings. The shield layers include a dielectric layer formed of dielectric material having a dielectric constant greater than the material of the intermetal dielectric layer. The shield layers include horizontally offset trenches to stop horizontal flow of current in the shield layers. The offset ensures there is no vertical path from the passivation layer to lower/ground potentials through the shield layers.

13 Claims, 14 Drawing Sheets

(56) References Cited

U.S. PATENT DOCUMENTS 8,890,223 B1 11/2014 Bonifield et al.
9,299,697 B2 3/2016 West et al.
9,583,558 B2 2/2017 West et al.
9,768,245 B2 9/2017 West et al.
10,147,784 B2 12/2018 West et al.
11,587,955 B2 * 2/2023 Li ........................ H01L 27/124
2005/0082075 A1 * 4/2005 Lien .................... H01L 23/5225 174/394
2007/0004198 A1 * 1/2007 Paul .................... H01L 23/5225 438/669
2008/0277761 A1 11/2008 Mahalingam et al.
2009/0124073 A1 5/2009 Liu et al.
2010/0167522 A1 7/2010 Daubenspeck et al.
2014/0080282 A1 * 3/2014 Chiang ................... H01L 28/40 257/E21.011
2014/0097516 A1 * 4/2014 Dubois ............... H01L 23/5223 257/532
2014/0367831 A1 * 12/2014 Yen ..................... H01L 23/5223 257/595
2016/0172434 A1 6/2016 West et al.
2016/0218169 A1 * 7/2016 Yen ....................... H01L 27/016
2017/0263696 A1 9/2017 West et al.
2018/0332707 A1 11/2018 Akahoshi et al.
2019/0074350 A1 * 3/2019 West ................. H01L 29/66477
2019/0206981 A1 * 7/2019 Bonifield ............... H01G 4/012
2020/0013713 A1 * 1/2020 West ................... H01L 23/5223
2020/0020644 A1 * 1/2020 Lee ....................... G06F 30/398
2020/0235197 A1 7/2020 Sizov et al.
2020/0335436 A1 * 10/2020 Shrivastava ........ H01L 23/5223
2021/0159224 A1 * 5/2021 Shen ....................... H01L 28/75
2021/0193791 A1 * 6/2021 Kasha ..................... H01L 28/60
2021/0202375 A1 7/2021 Fowler
2021/0407991 A1 * 12/2021 Or-Bach ............. H01L 27/0688
2022/0020684 A1 * 1/2022 Yen ....................... H01L 27/016
2022/0293844 A1 * 9/2022 Martin ................... H10N 69/00
2022/0328411 A1 * 10/2022 Or-Bach ........... H01L 23/53257
2022/0352092 A1 * 11/2022 Chang ..................... H01L 24/80

* cited by examiner

SHIELDING USING LAYERS WITH STAGGERED TRENCHES

CROSS-REFERENCE TO RELATED APPLICATION(S)

This application claims benefit of provisional application 63/213,537 filed Jun. 22, 2021, entitled "Shielding Using Layers With Staggered Trenches", naming Thomas C. Fowler and Jerome T. Wenske as inventors, which application is incorporated herein by reference.

BACKGROUND

Field of the Invention

This application relates to capacitors and more particularly to capacitors used for isolation applications.

Description of the Related Art

Isolation communication channels are utilized in various applications where necessary to prevent current flow between separate isolated electric circuits while still maintaining communication between the circuits. The isolation may be required for signal isolation, safety, or for other reasons. The isolation communication channels may be implemented using capacitive techniques.

Referring to FIG. 1 a typical isolation capacitor 100 includes a top metal plate 101, a bottom metal plate 103 above a silicon substrate 114, and a region of insulator material such as SiO2 between the bottom metal plate and the top metal plate. A top dielectric layer 105, also referred to herein as a passivation layer, serves as a barrier to protect the integrated circuit from production damage and environmental damage (such as moisture absorption) over time. One or more additional passivation layers (not shown), are typically formed above the top dielectric 105. The isolation capacitor 100 allows for low voltage signaling, e.g., of approximately 1-5 volts for transfer of information (e.g., based on pulse width of the signal or other information in the signal). The bond wire 116 used in the low voltage signaling will experience large non-signal voltages from hundreds to even thousands of volts relative to the integrated circuit, which high voltages are also applied to the top plate. The SiO2 layer isolates the large non-signal voltages from the circuits coupled to the bottom plate of the capacitor that process the information transmitted in the low voltage signaling using the capacitor. However, under large voltages the SiO2 layer can break down, damaging the integrated circuit such that the integrated circuit is no longer usable. Accordingly, improved capacitive isolation techniques are desirable.

SUMMARY OF EMBODIMENTS OF THE INVENTION

Accordingly in an embodiment an integrated circuit includes a substrate, a bottom conductive plate of a capacitor above the substrate and a top conductive plate above the bottom conductive plate. An intermetal dielectric layer is formed between the bottom conductive plate and the top conductive plate, the intermetal dielectric layer being formed of at least a first dielectric material. A plurality of shield layers are disposed between the top conductive plate and a portion of the intermetal dielectric layer. A first shield layer of the plurality of shield layers has a shield dielectric layer formed of at least a second dielectric material having a higher dielectric constant than the first dielectric material. The first shield layer includes a first trench extending through the first shield layer but not through a second shield layer of the plurality of shield layers.

In another embodiment, a method includes forming a bottom conductive plate above a substrate. The method further includes forming art intermetal dielectric layer of a first dielectric material, a portion of which intermetal dielectric layer is above the bottom conductive plate. A plurality of shield layers are formed above the intermetal dielectric layer and extend horizontally to at least beyond a guard ring. The plurality of shield layers include a first shield layer and a second shield layer. The first shield layer is formed of at least a second dielectric material, which has a higher dielectric constant than the first dielectric material. The first shield layer has a first trench extending through the first shield layer but not through the second shield layer. The method further includes forming a top conductive plate above the first and second shield layers.

In another embodiment, an integrated circuit includes a bottom conductive plate of a capacitor above a substrate and a top conductive plate. A passivation layer is formed above the top conductive plate. An intermetal dielectric layer is disposed above the bottom conductive plate and below the top conductive plate and is formed of a first dielectric material. A first shield layer is disposed under the top conductive plate and above the intermetal dielectric layer and includes a first dielectric layer formed of at least a second dielectric material. The second dielectric material has a higher dielectric constant than the first dielectric material. The first shield layer further includes a first charge distribution layer and has a first trench to block a horizontal current path through the first shield layer. A second shield layer is underneath the first shield layer and includes a second dielectric layer formed of at least the second dielectric material. The second shield layer further includes a second charge distribution layer. The second shield layer has a second trench to block another horizontal current path through the second shield layer. The first trench and the second trench are horizontally offset and are separated by an overlap region formed by a portion of the first shield layer and another portion of the second shield layer.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
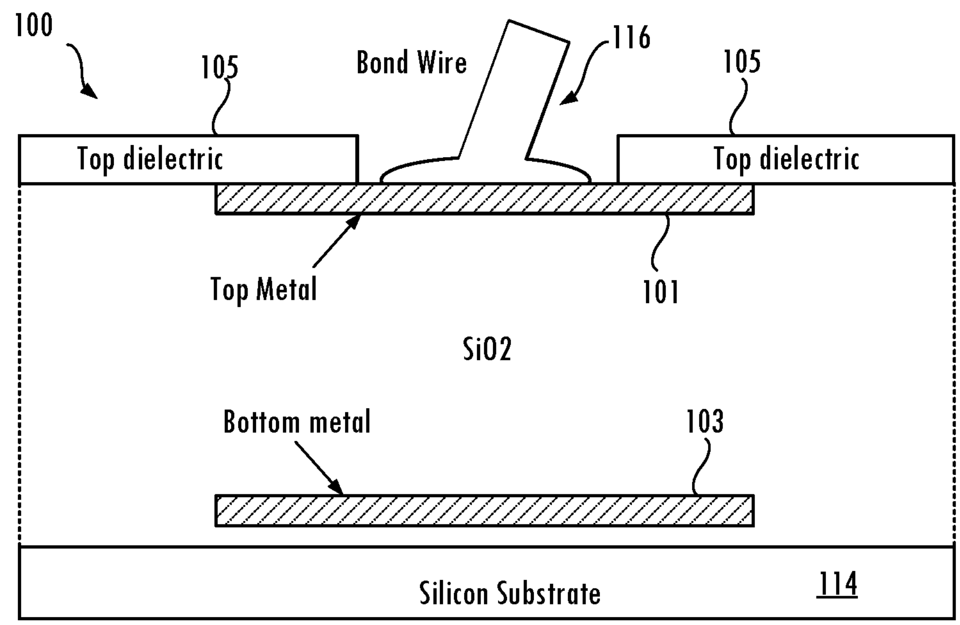
FIG. 1 illustrates a typical isolation capacitor structure.

Traditional isolation capacitors shown in FIG. 1 do not have the breakdown strength expected of a silicon dioxide dielectric due to peak fields that occur at the edges of the isolation capacitor plate. Embodiments described herein improve the breakdown strength of the insulating layer by blocking current flow from the passivation layer down to guard ring or circuit metal in the integrated circuit and also block lateral transmission of high voltage signals as described further herein.

Figure 2:
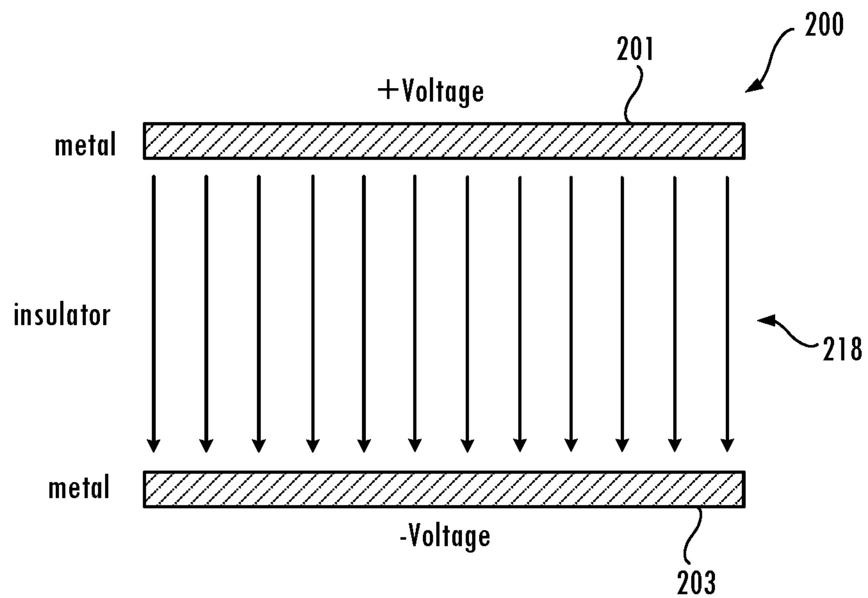
FIG. 2 illustrates simplified electric fields in a cross section of a parallel plate capacitor.

FIG. 2 illustrates a simplified model of electric fields in a cross section of a parallel plate capacitor 200. The parallel plate capacitor includes a top metal plate 201 and a bottom metal plate 203. Field lines 218 extend through the insulating material from the top metal plate to the bottom metal plate. The conventional parallel plate capacitor equation is $C=\varepsilon_o/k\times A/d$, where $\varepsilon_o$ is permittivity of free space, k is material relative permittivity (written sometimes as $\varepsilon_r$), A is plate area, and d is the spacing between the top plate 201 and the bottom plate 203. The electric field E=V/d, where d is the spacing between plates and V is the applied voltage. The simple capacitor equation shows a uniform field between the plates as a result of an applied voltage. The uniform field is shown as evenly spaced field lines 218 to represent the E-field. However, this uniform field would only exist in an infinitely wide structure. In actuality, the electric field at the edges is higher, and at sharp metal corners, the field can be infinitely high.

Figure 3:
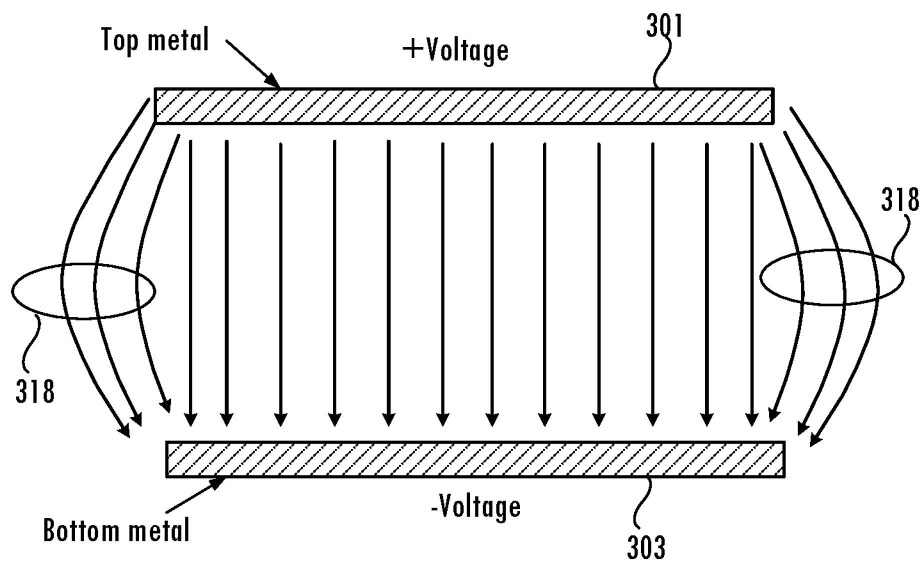
FIG. 3 illustrates fringe fields associated with a finite width parallel plate capacitor.

Referring to FIG. 3, rather than a uniform electric field as shown in FIG. 2, a finite width parallel plate capacitor has fringe fields extending from the plate 301 to plate 303 as shown by the field arrows 318. The fringe fields cause a field increase at plate corners as shown by the increased number of field lines that terminate near the corners of the capacitor plates. While theory says that an infinite field exists at a sharp corner, in reality, materials would breakdown in an infinite field. One approach to avoiding peak fields at corners would be to round the metal edge if the technology permits. However, rounding the edges of the metal plate is not practical in integrated circuit manufacturing. For lower voltage polysilicon gates, beveling is used to reduce the peak fields, but this is not practical for the oxide thickness used for the isolation capacitors.

Figure 4:
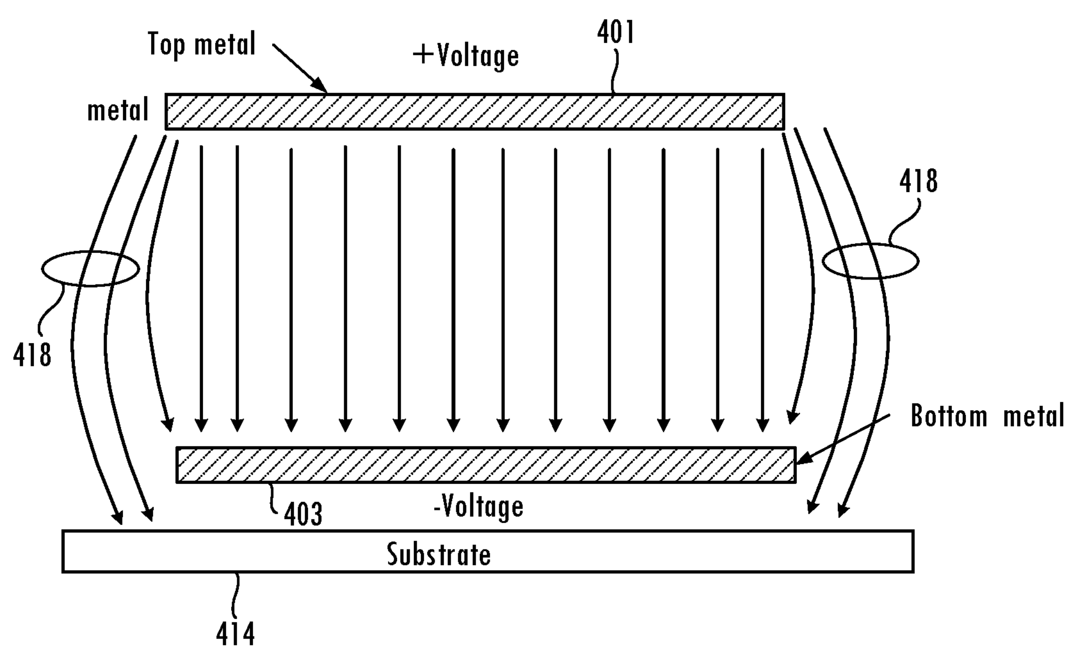
FIG. 4 illustrates field lines terminating at the substrate when the bottom plate is built over the substrate and is at a similar potential.

Referring to the capacitor structure shown in FIG. 4, the bottom plate 403 is built over a substrate 414 and the bottom plate 403 is at a similar potential to the substrate 414, e.g., close to ground. As a result, some field lines 418 from the top plate 401 terminate at the substrate. That results in the field not increasing as much at the plate edges on the bottom plate as compared to the bottom edge of the top plate.

Figure 5:
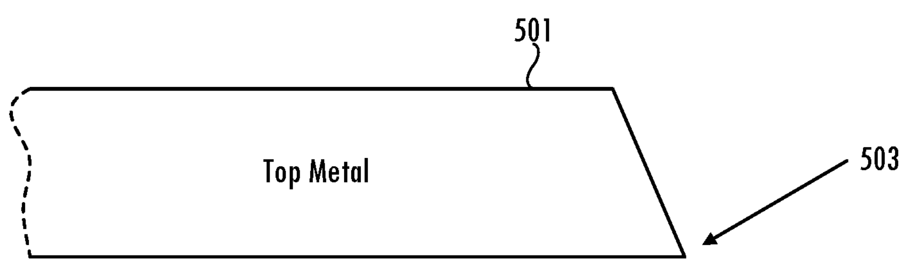
FIG. 5 shows a cross section of a metal plate with a trapezoidal structure.

FIG. 5 shows a cross section through a typical thick metal layer used as a top plate 501. As can be seen, the metal plate cross section often has a trapezoidal shape as a result of processing rather than being strictly rectangular. The trapezoidal shape includes a sharp angle at 503, which will result in very high fields at the corner location 503 and along the entire perimeter of the edge of the top metal plate. Mitigating the effects of very high fields in structures with sharp edges improves the reliability of integrated circuits with isolation capacitors.

Figure 6:
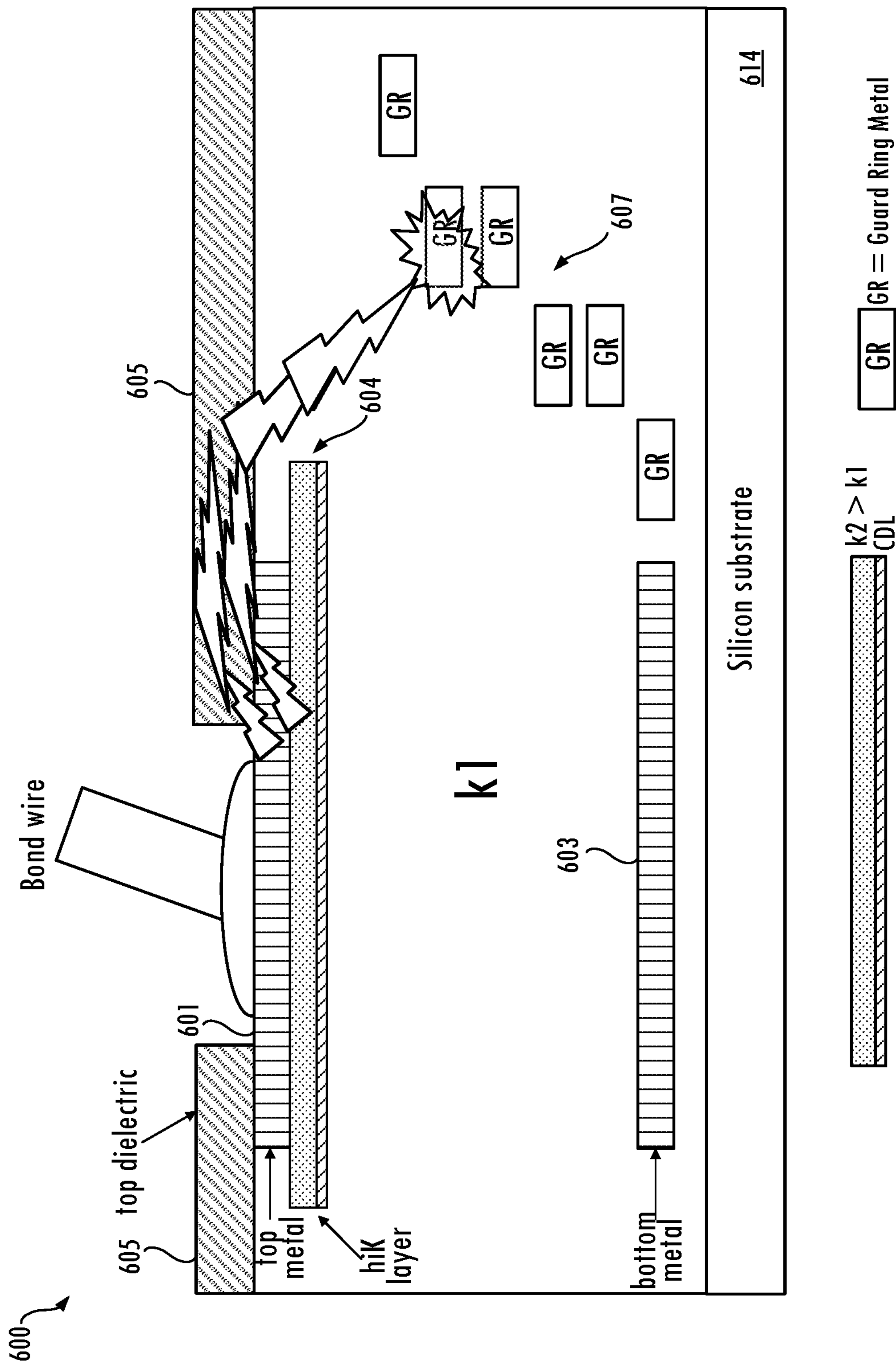
FIG. 6 illustrates a technique to mitigate failures in isolation capacitors.

One technique to reduce the risk of failure resulting from high fields around the edge of the top metal plate of a capacitor adds a high dielectric constant (HiK) material at the location of the peak fields as described, e.g., in U.S. patent application Ser. No. 16/726,477, filed Dec. 24, 2019, entitled "High Dielectric Constant Material At Locations of High Fields", and naming Dan B. Kasha et al., as inventors, which application is incorporated herein by reference. FIG. 6 shows another technique to mitigate failures in isolation capacitors. The capacitor structure 600 in FIG. 6 includes a top metal plate 601 and a bottom metal plate 603 above a silicon substrate 614 separated by an intermetal dielectric (IMD) layer having a dielectric constant of k1. An additional layer 604 is disposed under the top metal plate 601 and is formed of a high dielectric constant (HiK) material such as silicon nitride, having a dielectric constant of k2, where k2>k1 (e.g., $k1=SiO_2=3.9$ and $k2=Si_3N_4=7.5$). The additional layer 604 also includes a charge distribution layer (CDL) formed of a material such as silicon rich oxide (SRO). CDL is conductive at ultra high voltages (e.g., >500 V) such as those experienced in isolation capacitors and helps to spread the electric field, thereby reducing the electric field. The hiK material of layer 604 reduces the voltage drop across layer 604, and therefor reduces the size of the high-field regions that are concentrated at the corner of the top plate. If the high-dielectric material is able to withstand the fields better than the IMD formed, e.g., of SiO2, a higher overall breakdown strength can be achieved.

However, while breakdown voltage increased, failure analysis shows that failure can still occur where the HiK (or HiK+CDL) layer ends. In an embodiment, the capacitor shown in FIG. 6 experiences normal use voltages of 1,500 V RMS but surge voltages can be as high as 20,000 V. When an ultra-high voltage (>500V), and particularly a surge voltage, is applied to the top plate of a silicon integrated circuit based isolation capacitor, electric charge can travel horizontally through the passivation layers 605 of these isolation devices. FIG. 6 illustrates the failure mechanism graphically as the electrical charge travels from the high voltage top plate 601 horizontally along the passivation layer 605 (also referred to herein as the top dielectric layer) until the charge is beyond the edge of the layer 604 and then travels down to a low/ground potential metallization such as the guard rings (GR) 607, or other low voltage circuitry. The guard rings 607 are formed by metal on various layers electrically connected together through vias to a ground connection (not shown) and protect circuits outside the guard ring. The circuitry in an isolation capacitor application can operate, e.g., at ~30V, which is a low potential compared to operational voltages of 1,500 V RMS or the surge voltage. At such high surge voltages, e.g. 20,000 V, existing techniques do not provide full shielding of guard rings or circuitry components in the integrated circuit from charge travelling from the high voltage on the top metal plate horizontally through the passivation layers of silicon based isolation devices. The end of the HiK and CDL layer 604, or other gaps in the HiK and CDL layer allows for a weak breakdown path from the passivation layer through dielectric material (such as SiO2) to guard rings or circuitry in lower layers.

One solution to avoid the charge finding a path to low/ground potential chip areas such as guard rings or lower voltage circuitry, is to make the layer 604 continuous across the integrated circuit. However, if the HiK layer is continuous, depending on material, and in combination with a Charge Distribution Layer (CDL), that continuous layer can create a path for a horizontal short that would cause the integrated circuit to fail.

Figure 7:
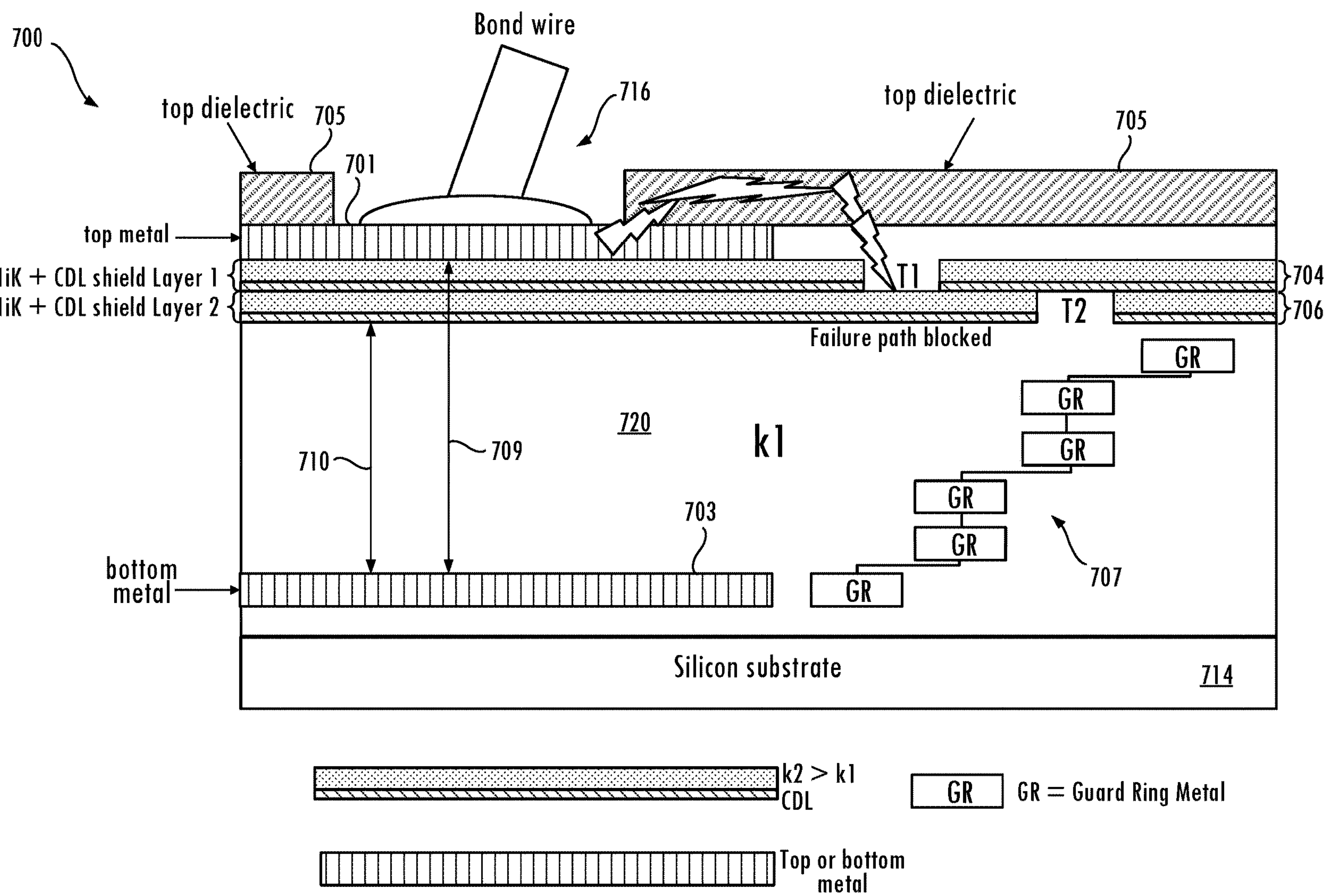
FIG. 7 illustrates an embodiment of a capacitor and shield structure that utilizes shield layers with offset trenches.

Referring to FIG. 7, an embodiment utilizes HiK plus CDL shield layers 704 and 706 with trenches inserted in a staggered fashion such that low/ground potentials are completely shielded from charges travelling horizontally in the passivation layers 705 at the die top surface, while still breaking the potential continuous circuit path created by the layers of HiK or HiK+CDL material. The lack of a path from the horizontal travelling charge to low/ground potentials due to multiple shield layers completely shields the guard rings and lower level circuits. The trenches in the layers 704 and 706 function to break the potential continuous circuit path created by a blanket of HiK or HiK+CDL material. The resistance of the layers ensures that the field drops as it extends horizontally.

The capacitor structure 700 includes a top plate 701 and a bottom plate 703 above a silicon substrate 714. An intermetal dielectric (IMD) layer 720 (e.g., SiO2) having a dielectric constant of k1 separates the top plate 701 and the bottom plate 703. A bond wire 716 is attached to the top plate. A double stack of shield layers 704 and 706 is formed of a HiK material (e.g., silicon nitride ($Si_3N_4$)) and a charge distribution layer (CDL) formed by SRO. Layer 704 includes a trench shown as T1. However, the trench T1 only goes through the first layer 704. The trench T1 cuts the path that could otherwise be used by the current to flow along the CDL layer. The shield layer 706 blocks a potential weak breakdown path to the guard rings 707 or other circuitry below from the passivation layer 705. Thus, as graphically shown in FIG. 7, the electrical path from the top metal plate through the passivation layer and to the trench T1 is blocked by layer 706. The layer 706 also includes a trench T2. The trench T2 cuts the horizontal path that could otherwise be used by the current to flow along the CDL layer in 706. The shield layer 704 that is intact above the trench T2 blocks a potential weak breakdown path to the guard rings 707 or other circuitry below from the passivation layer. Thus, the trenches are staggered so that the lateral path is disrupted without providing a vertical path to layers below. Use of staggered trenches (opening that is offset from layer to layer) in two or more layers that each include HiK materials (combined with one or more CDLs) next to the high voltage (top) plate of an isolation capacitor provides a complete shielding from horizontal charge from above while spreading the fields from above and increasing the breakdown voltage. Note that the shield layers 704 and 706 are shown to the right of the top metal plate 701. The slice of the capacitor structure shown in FIG. 7 also includes trenches similar to T1 and T2 to the left of the top metal plate of the capacitor but they are not shown for ease of illustration. Note that the HiK materials could be the same HiK material for each layer, e.g., silicon nitride, or could be a combination of multiple HiK materials such as silicon nitride or silicon oxynitride. In embodiments, the trench width of T1 and T2 should be greater than the distance 709 between the top metal plate and the bottom plate 703 of the capacitor. In other embodiments one or more of the trenches T1 and T2 have a width greater than the distance 710 between the bottom of shield layer 706 and the bottom metal plate 703. Having a sufficient width helps ensure that breakdown does not occur across the trench. In an embodiment the distance 709 is approximately 5-15 microns but the distance depends on the desired capacitance and the materials being used. In an embodiment, each of the shield layers has a HiK layer>0.25 μm and the CDL layer>than 0.1 μm. The staggered layout of T1 and T2 ensures there is overlap (OL) area between the trenches and thus at least one shield layer between the passivation layer and low/ground voltage regions of the integrated circuit.

Figure 8:
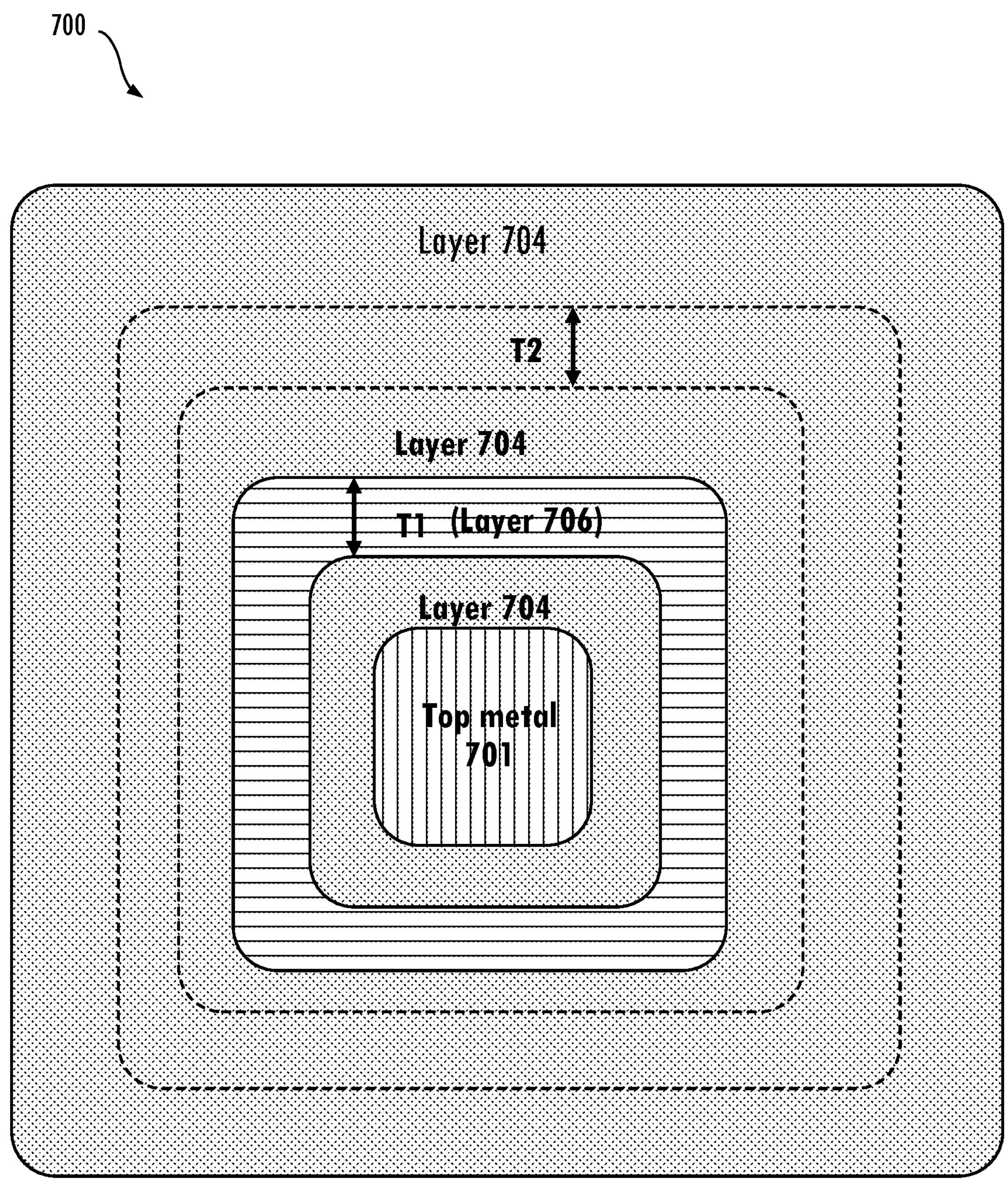
FIG. 8 illustrates a plan view of an embodiment of a capacitor and shield structure.

FIG. 8 shows a plan view of the capacitor structure 700 shown in FIG. 7. FIG. 8 shows the top metal plate 701 and underneath and surrounding the top metal plate is the first HiK+CDL shield layer 704. The trench T1 surrounds the top metal plate and FIG. 8 shows the second layer 706 underneath the trench T1 that serves to block the path to low/ground voltage regions. Layer 704 then resumes after trench T1 ends. Trench T2 is indicated by the dotted lines underneath layer 704. The layer 704 serves to block any path through trench T2 to low/ground voltage regions. Note that in embodiments, the layers 704 and/or 706 extend to close to the end of the integrated circuit. The layers should extend at least past the guard rings to ensure there is no easy path from the passivation layers to the guard rings or relatively low voltage circuitry below. How far the HiK+CDL layers 704 and 706 extend depends at least in part on the process technology and whether it is more cost efficient to extend the layers to near the edges of the integrated circuit to thereby provide a blanket of the layers 704 and/or 706 across the entire integrated circuit or to stop one or more of the layers sooner.

Making the capacitor structure illustrated in FIGS. 7 and 8 includes depositing the bottom metal plate 703, depositing the IMD layer 720, depositing the shield layers 704 and 706 including appropriate patterning and etch steps to form the trenches, depositing the top metal plate 701, and any necessary patterning and etch steps for the various capacitor components and layers.

Figure 9:
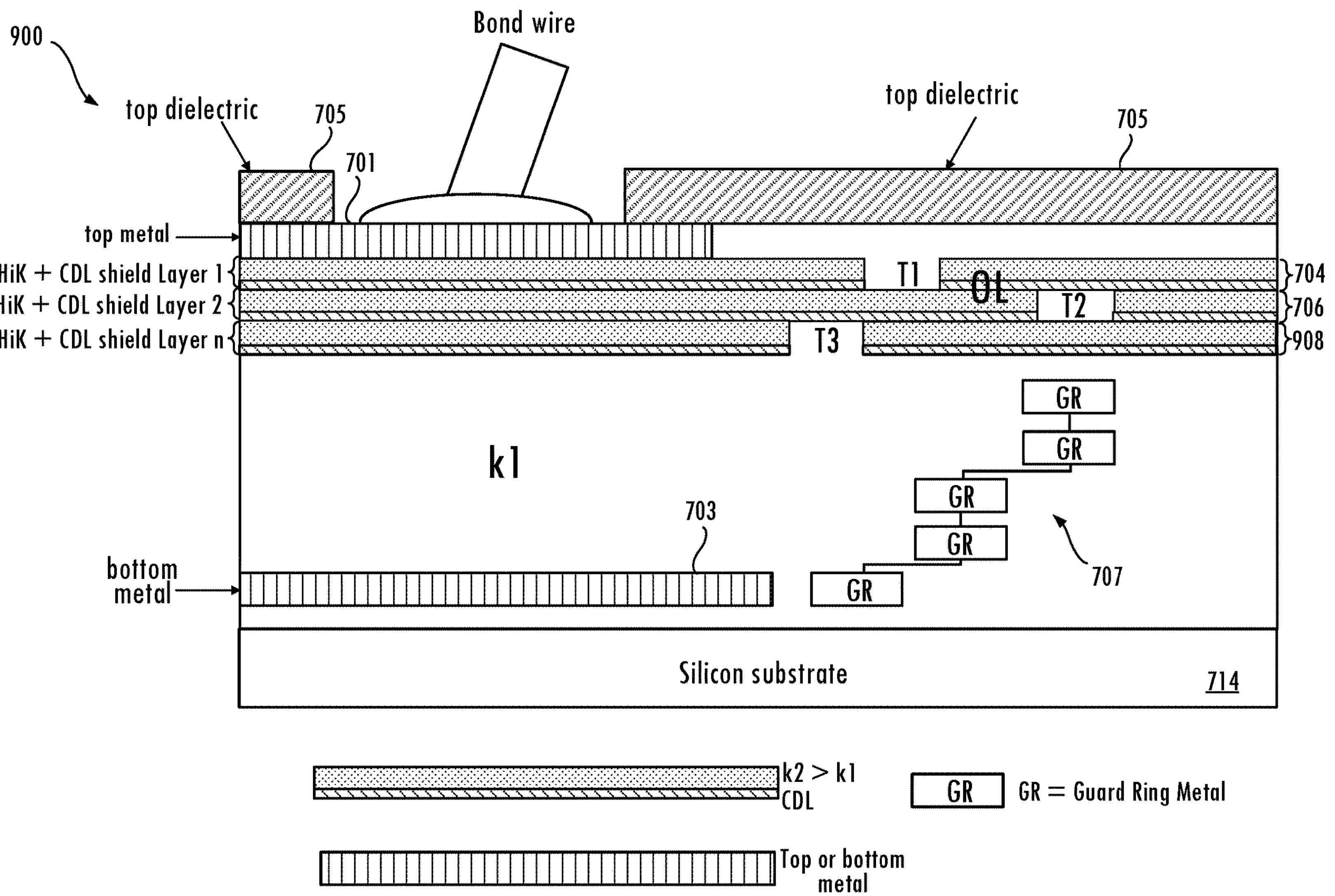
FIG. 9 illustrates an embodiment of a capacitor and shield structure with three or more shield layers.

FIG. 9 illustrates another embodiment shown as capacitor structure 900. The structure 900 is similar to the capacitor structure 700 shown in FIG. 7 but includes an extra one or more shield layers 908 in addition to the layers 704 and 706. The extra layer(s) help to further reduce the chances of breakdown from normal operational or surge voltages. In the embodiment of FIG. 9, the one or more additional layers 908 includes a trench T3 to break the current path in the CDL of the nth layer 908. The width of the trench T3 is preferably the same as described for T1 and T2. Note that in some embodiments T1, T2, and T3, have different widths, with the minimum width of at least one trench in a layer preferably being determined based on the height of the capacitor (see, e.g., distance 709 or 710 in FIG. 7). The number of shield layers chosen depends on factors such as the materials in the stack, the voltages to be expected on the top plate, and design requirements.

Figure 10:
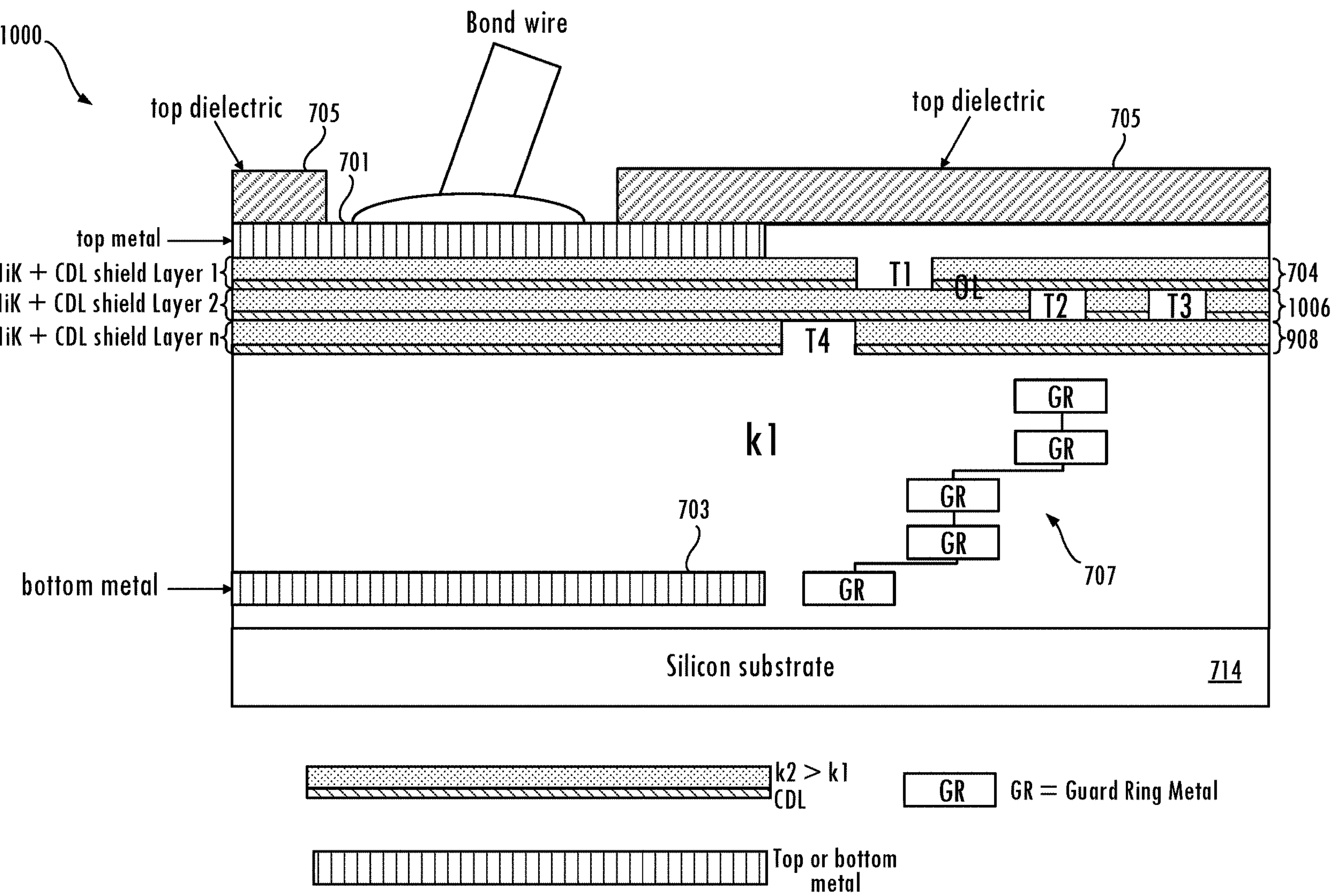
FIG. 10 illustrates an embodiment that utilizes at least one shield layer with multiple trenches.

FIG. 10 illustrates an embodiment similar to the capacitor structure 900 of FIG. 9 with n HiK+CDL layers 704, 1006, and 908. The capacitor and shield structure 1000 includes one or more shield layers, which in the illustrated embodiment is layer 1006, that have at least two trenches with the first shown as T2 and the second trench shown as T3. The extra one or more trenches helps ensure that horizontal current flow is interrupted in that particular layer. While one layer is shown with additional trenches inserted, any number of layers or all of the layers can utilize additional trenches.

Figure 11:
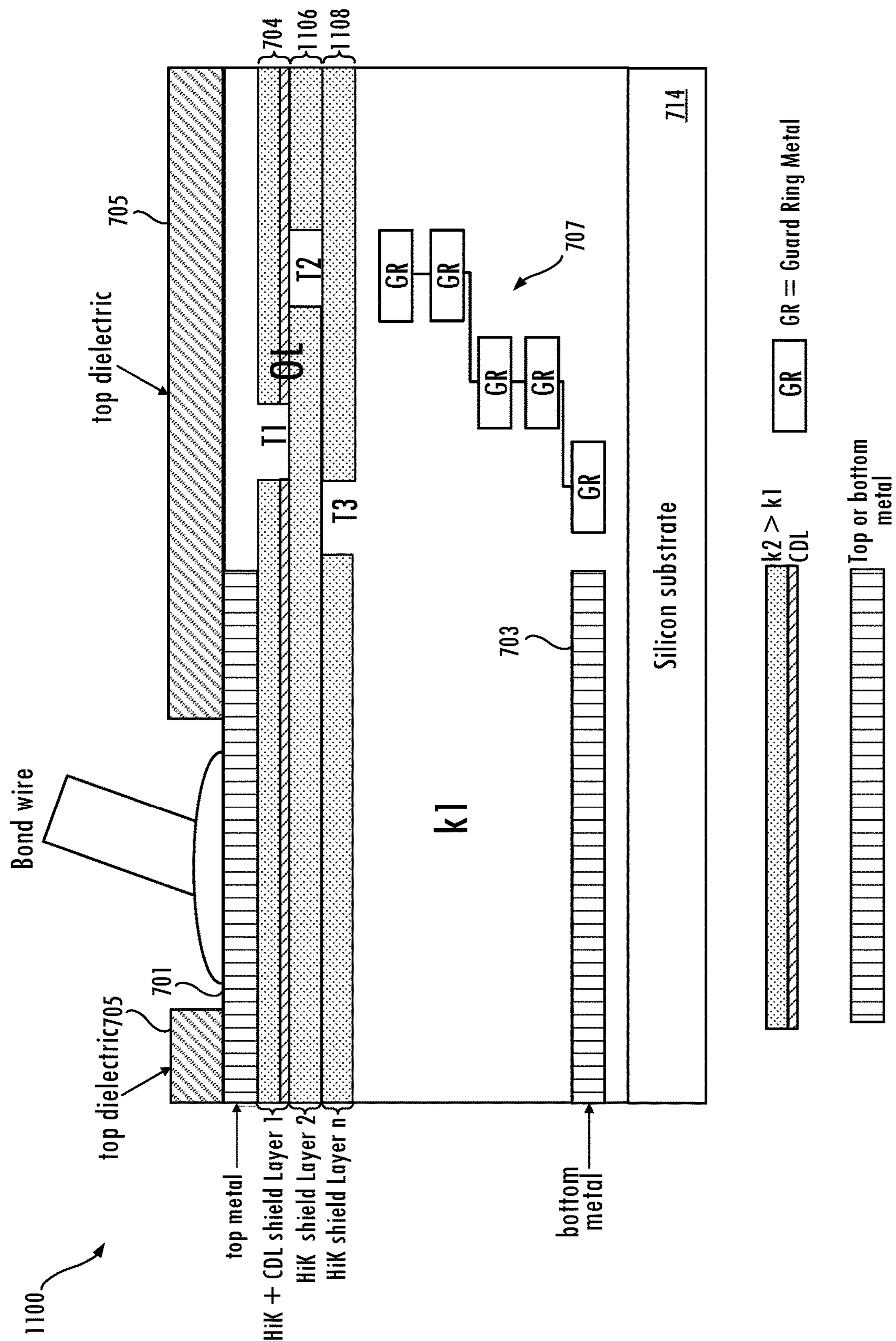
FIG. 11 illustrates an embodiment of a capacitor and shield structure that combines one or more high dielectric constant material/CDL shield layers with layers of high dielectric only material(s).

FIG. 11 illustrates another embodiment 1100 of a capacitor and shield structure that combines some number of HiK/CDL shield layers 704 (one or more) stacked and staggered with n layers of HiK (k2>k1) only materials shown as layer 1106 and 1108. The HiK only layers can be formed of the same HiK material for each layer (e.g., all layers silicon nitride) or one or more of the layers is formed as a combination of multiple HiK (k2, k3 . . . kn) materials (such as silicon nitride, silicon oxynitride, etc.), where k2, k3, kn are >k1. One or more of the layers can be formed by one or more HiK material while other layers are formed by one or more HiK materials with at least one of the HiK materials in at least one of the layers being different. Note that charge can still flow between the boundaries of the HiK dielectric layers so the trenches T2 and T3 serve the same function as T1 to reduce the potential horizontal current flow.

Figure 12:
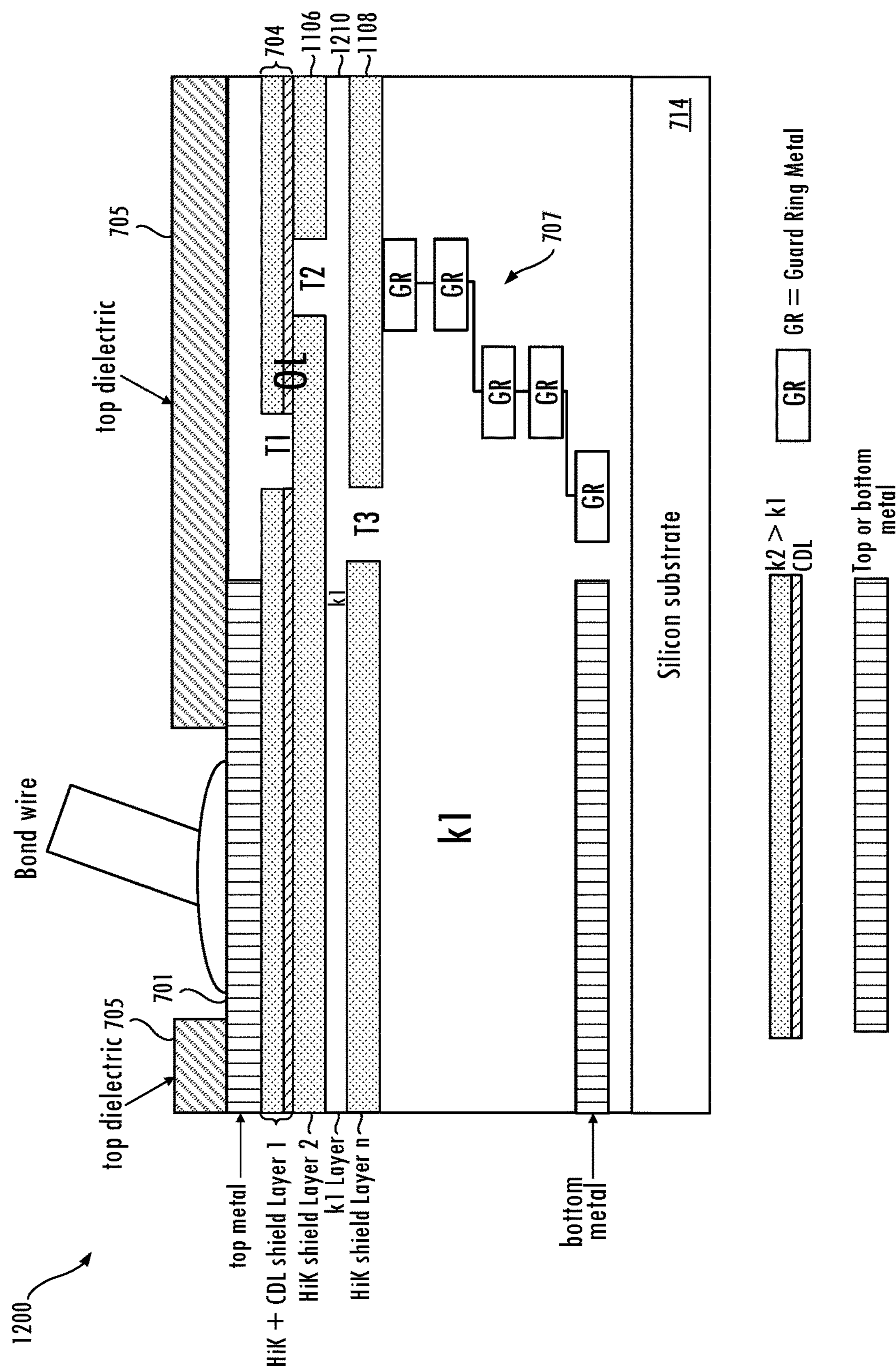
FIG. 12 illustrates an embodiment of a capacitor and shield structure in which IMD material is sandwiched between one or more of the high dielectric constant layers.

FIG. 12 illustrates an embodiment 1200 of a capacitor and shield structure in which a layer 1210 of the k1 capacitor dielectric material is sandwiched between one or more of the HiK layers formed of one or more dielectric materials having a dielectric constant greater than k1. Layer 1210 serves as an additional mechanism to break the continuous horizontal interface between two depositions of HiK materials.

Figure 13:
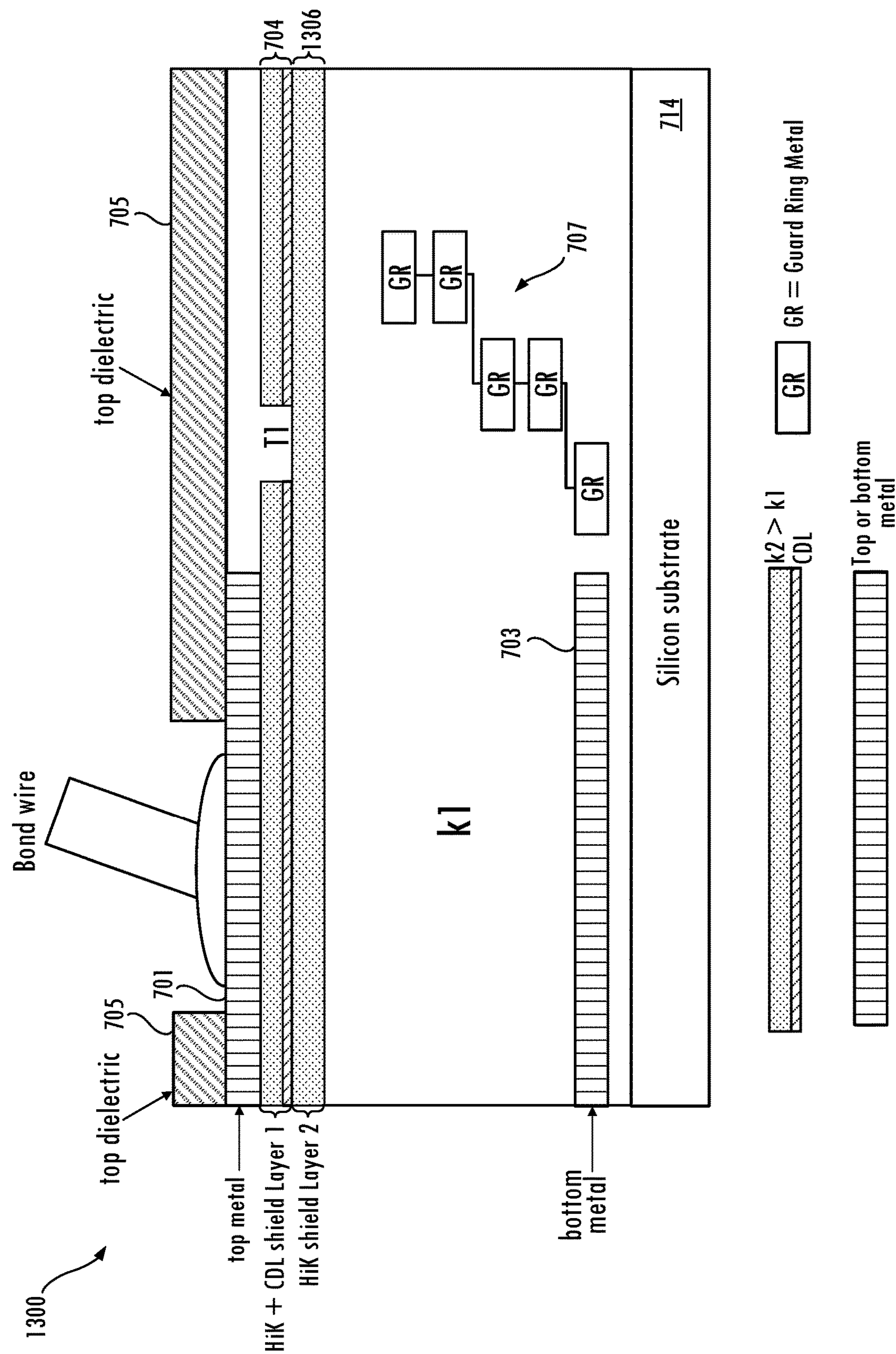
FIG. 13 illustrates an embodiment having a high dielectric constant material/CDL shield layer and shield layer formed only with high dielectric constant material(s).

FIG. 13 illustrates an embodiment 1300 of a capacitor and shield structure in which a single HiK layer 1306 without any trenches serves to block a vertical current flow through the T1 trench in layer 704.

Figure 14:
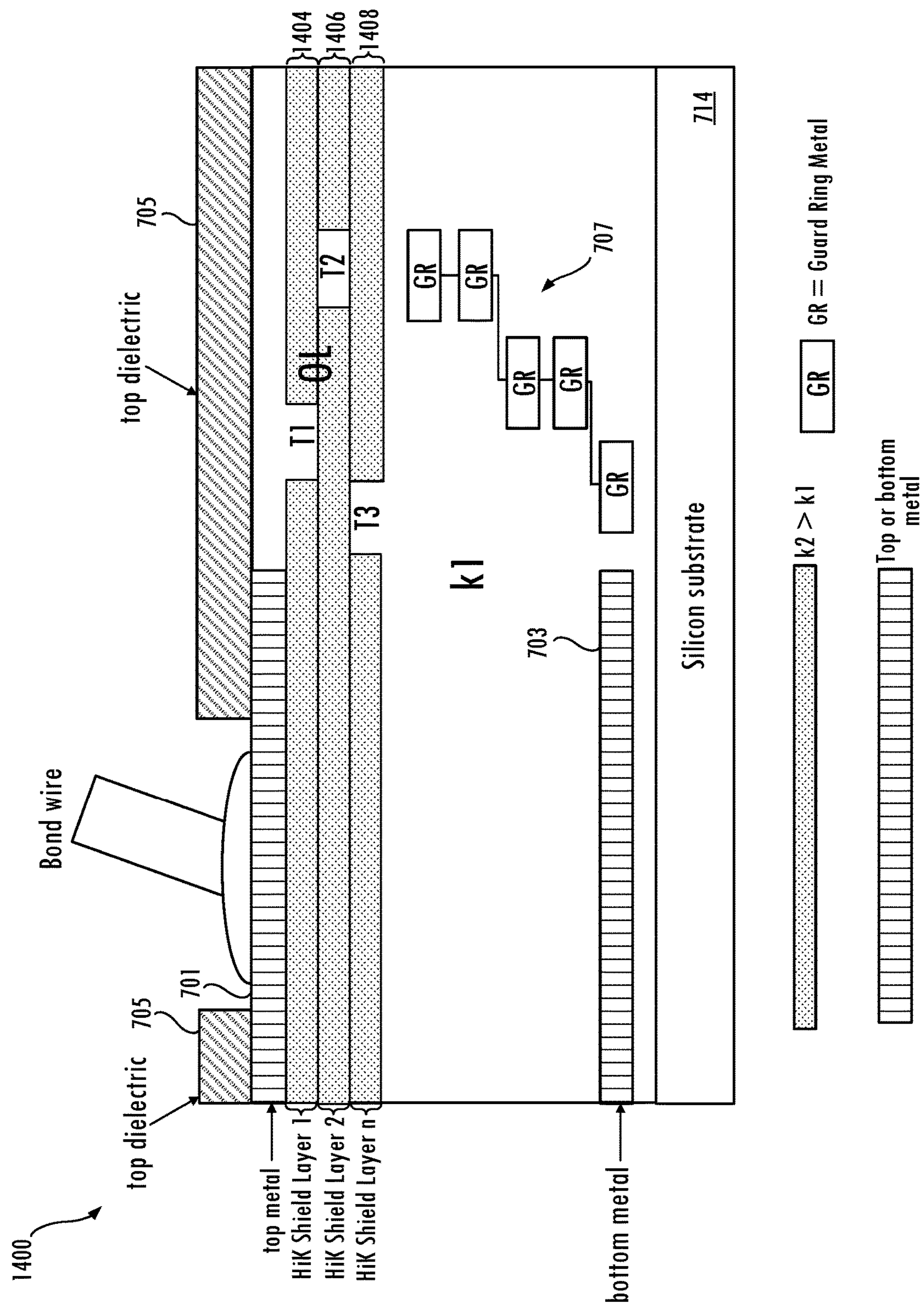
FIG. 14 illustrates an embodiment that uses only high dielectric constant stacked materials.

FIG. 14 illustrates an embodiment 1400 of a capacitor and shield structure that uses only HiK (k2>k1) stacked materials rather than including a CDL in one or more of the layers. Each of the HiK layers can be formed of the same HiK material (all layers silicon nitride) or could be a combination of multiple HiK (k2, k3, . . . , kn) materials such as silicon nitride or silicon oxynitride. Another embodiment includes layers of the k1 capacitor dielectric material sandwiched between each of the HiK layers formed of one or more dielectric materials having a dielectric constant greater than k1.

Making the capacitor structures shown in FIGS. 9-14 includes depositing the bottom metal plate 703, depositing the IMD layer, depositing the shield layers with appropriate patterning and etch steps to form the desired trenches, depositing the top metal plate 701, and any additional patterning and etch steps needed for the various capacitor components and layers.

Figure 15:
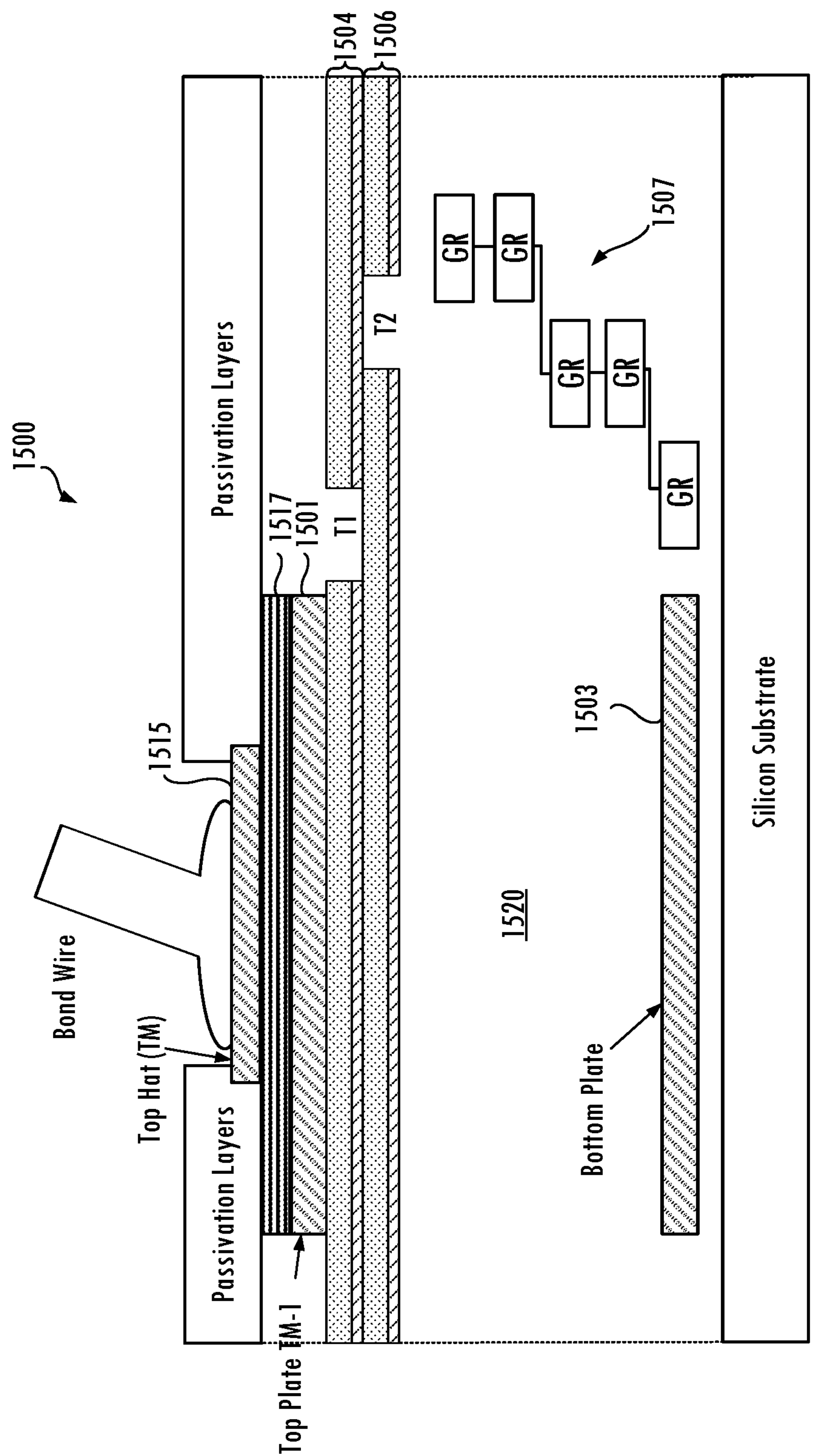
FIG. 15 illustrates an embodiment that includes a top hat structure for the top metallization with shield layers under the top metal plate.

In another embodiment, the metallization of the top metal plate is modified to include a top hat structure as shown in FIG. 15. Top hat structures are described in U.S. patent application Ser. No. 16/728,224, filed Dec. 27, 2019, entitled "Top Hat Structure for Isolation Capacitors", and naming Thomas C. Fowler et al., as inventors, which application is incorporated herein by reference. FIG. 15 illustrates an embodiment of an isolation capacitor structure 1500 having a "top hat" metal plate 1515 above the top metal plate 1501 of the capacitor thereby reducing fields in the passivation layers. The isolation capacitor structure 1500 includes a top metal plate 1501 and a bottom metal plate 1503 separated by an IMD layer 1520. The IMD layer 1520 is, e.g., 5-25 microns thick, with the thickness depending on such factors as the capacitance desired and the material used for the IMD layer. A top metal top hat plate 1515 sits above the top metal plate 1501 and is separated from the top metal plate by IMD material 1517 between the top metal plate 1501 and the top hat structure 1515. In embodiments, the IMD material is a standard oxide such as SiO2 and can be the same as the oxide in the stack of the primary isolator capacitor formed by top metal plate 1501 and bottom metal plate 1503. In other embodiments the IMD layer 1520 is an alternative insulator material such as silicon nitride, silicon rich oxide, or silicon oxynitride. The structure shown in FIG. 15 provides a series capacitor with the added capacitor formed by the top hat plate and the top metal plate of the primary capacitor. Note that since the top hat structure is now the highest metal, it is referred to as being top metal (TM), whereas the top metal plate is now TM-1, or one metal layer down. For example, in an embodiment, the top hat is in M8 and the top metal plate is in M7. The top hat embodiment further includes shield layers 1504 and 1506 to prevent charge from traveling horizontally through the passivation layers and then down to the low/ground potential metals such as guard rings 1507.

Figure 16:
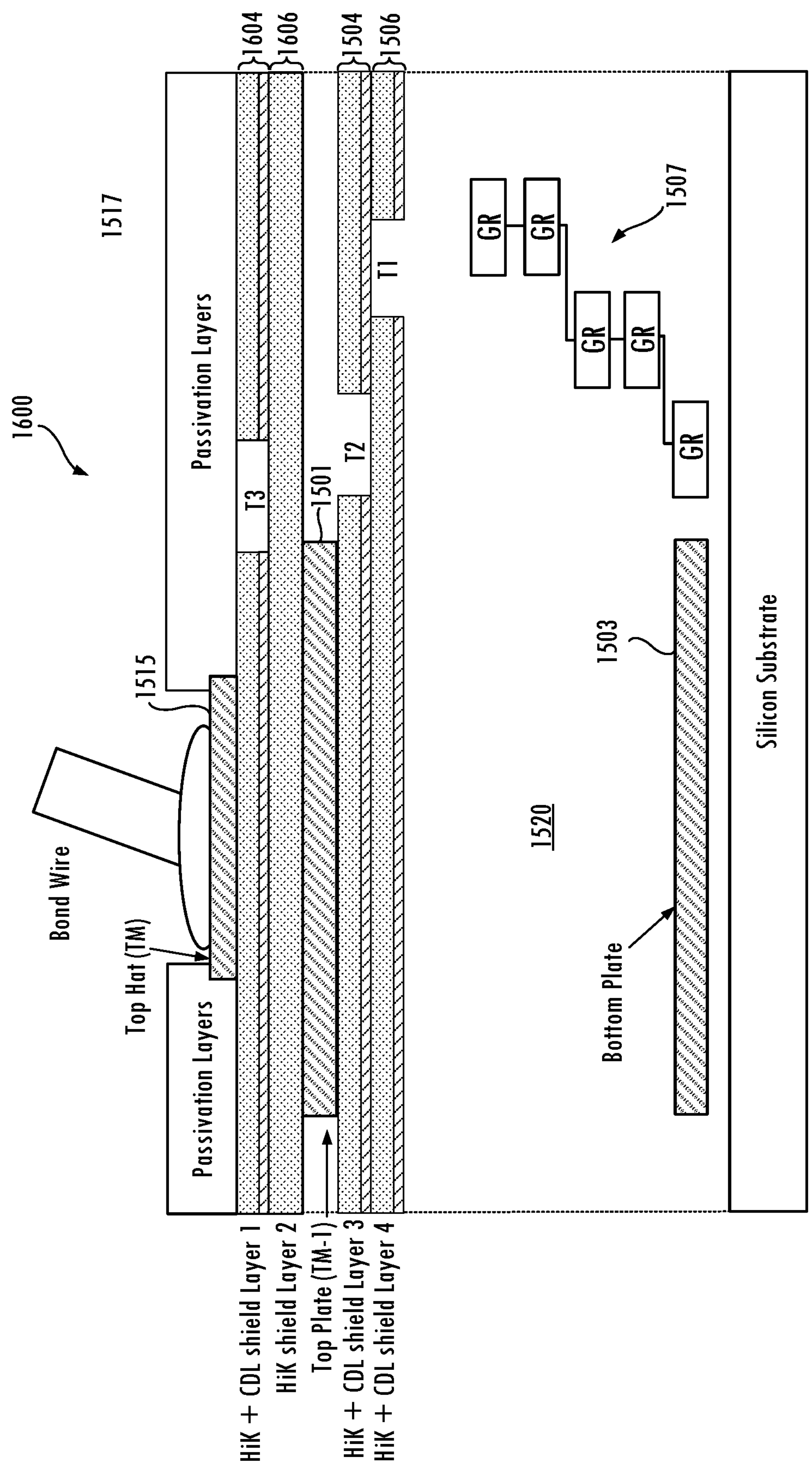
FIG. 16 illustrates an embodiment that includes a top hat structure for the top metallization along with shield layers under the top hat and the top metal plate.

FIG. 16 illustrates another embodiment of an isolation capacitor structure 1600 having a "top hat" metal plate 1515 above the top metal plate 1507 of the capacitor thereby reducing fields in the passivation layers. An IMD layer 1520 of the isolation capacitor structure 1600 is disposed between the top metal plate 1501 and the bottom metal plate 1503. The IMD layer 1520 is, e.g., 5-25 microns thick, with the thickness depending on such factors as the capacitance desired and the material used for the IMD layer. The top metal top hat plate 1515 sits above the top metal plate 1501 and is separated from the top metal plate by shield layers 1604 and 1606. The shield layer 1604 is formed of a HiK+CDL layer. The shield layer 1606 is a HiK shield layer. The top capacitor structure 1600 further includes shield layers 1504 and 1506 to prevent charge from traveling horizontally through the passivation layers and then down to the low/ground potential metals such as guard rings 1507. Note that embodiments may omit shield layers 1504 and 1506.

While several top hat embodiments are shown in FIGS. 15 and 16, the various top hat structures described in patent application Ser. No. 16/728,224 can also advantageously use the shield layers 1504 and 1506 and/or the shield layers 1604 and 1606. Further, the various embodiments of shield layers described herein can be utilized with the top hat structure shown in FIGS. 15 and 16 or other top hat structures described in application Ser. No. 16/728,224, which application is incorporated by reference herein.

Thus, a capacitor structure has been described that reduces the chance of capacitor failure in the presence of either operational voltages or surge voltages. The description of the invention set forth herein is illustrative and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. An integrated circuit comprising:

a bottom conductive plate of a capacitor above a substrate;

a top conductive plate of the capacitor above the bottom conductive plate;

an intermetal dielectric layer formed between the bottom conductive plate and the top conductive plate, the intermetal dielectric layer being formed of at least a first dielectric material;

a plurality of shield layers disposed between the top conductive plate and a portion of the intermetal dielectric layer; and wherein a first shield layer of the plurality of shield layers has a shield dielectric layer formed of at least a second dielectric material having a higher dielectric constant than the first dielectric material and the first shield layer includes a first trench extending through the first shield layer but not through a second shield layer of the plurality of shield layers.

2. The integrated circuit as recited in claim 1 wherein at least one of the plurality of shield layers includes a charge distribution layer in addition to the shield dielectric layer.

3. The integrated circuit as recited in claim 2 wherein the charge distribution layer is formed by silicon rich oxide (SRO).

4. The integrated circuit as recited in claim 2 wherein at least one of the plurality of shield layers does not include a charge distribution layer.

5. The integrated circuit as recited in claim 1 wherein the shield dielectric layer is formed by one or more of silicon nitride and silicon oxynitride.

6. The integrated circuit as recited in claim 1 wherein the second shield layer of the plurality of shield layers includes a second trench extending through the second shield layer and not the first shield layer and the second shield layer includes the second dielectric material.

7. The integrated circuit as recited in claim 6 wherein the first trench and the second trench are separated by an overlap region formed by portions of the first shield layer and the second shield layer.

8. The integrated circuit as recited in claim 1 wherein an additional layer of the first dielectric material is sandwiched between at least two of the plurality of shield layers.

9. The integrated circuit as recited in claim 1 further comprising at least two trenches in at least one of the plurality of shield layers.

10. The integrated circuit as recited in claim 1 wherein the first trench has a width that is based on a height of the capacitor.

11. The integrated circuit as recited in claim 1 further comprising:

a third shield layer of the plurality of shield layers below the second shield layer and above at least a portion of the intermetal dielectric layer; and a third trench formed in the third shield layer, the third trench extending through the third shield layer and not extending through the first shield layer or the second shield layer.

12. The integrated circuit as recited in claim 1 further comprising a bond wire attached to a top surface of the top conductive plate.

13. An integrated circuit comprising:

a bottom conductive plate of a capacitor above a substrate;

a top conductive plate of the capacitor;

a passivation layer is disposed above the top conductive plate;

an intermetal dielectric layer is disposed above the bottom conductive plate and below the top conductive plate and formed of a first dielectric material;

a first shield layer is disposed under the top conductive plate and above the intermetal dielectric layer, the first shield layer including a first dielectric layer formed of at least a second dielectric material, the second dielectric material having a higher dielectric constant than the first dielectric material, the first shield layer further including a first charge distribution layer;

wherein the first shield layer has a first trench to block a horizontal current path through the first shield layer;

a second shield layer underneath the first shield layer, the second shield layer including a second dielectric layer formed of at least the second dielectric material, the second shield layer further including a second charge distribution layer;

wherein the second shield layer has a second trench to block another horizontal current path through the second shield layer; and wherein the first trench and the second trench are horizontally offset and are separated by an overlap region formed by a portion of the first shield layer and another portion of the second shield layer.

* * * * *